US012795823B2

(12) United States Patent
Nishio et al.

(10) Patent No.: US 12,795,823 B2
(45) Date of Patent: Nov. 10, 2026

(54) MULTILAYER SUBSTRATE

(71) Applicant: Murata Manufacturing Co., Ltd., Nagaokakyo (JP)

(72) Inventors: Kosuke Nishio, Nagaokakyo (JP); Ryutatsu Mizukami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 246 days.

(21) Appl. No.: 18/830,893

(22) Filed: Sep. 11, 2024

(65) Prior Publication Data

US 2025/0008647 A1 Jan. 2, 2025

Related U.S. Application Data

(63) Continuation of application No. PCT/JP2023/014706, filed on Apr. 11, 2023.

(30) Foreign Application Priority Data

Apr. 18, 2022 (JP) ................................ 2022-067996

(51) Int. Cl.
*H05K 1/02* (2006.01)

(52) U.S. Cl.
CPC ... *H05K 1/0298* (2013.01); *H05K 2201/0141* (2013.01)

(58) Field of Classification Search
CPC .................... H05K 1/0298; H05K 2201/0141
USPC .......................................................... 174/251
See application file for complete search history.

(56) References Cited

U.S. PATENT DOCUMENTS

| | | | |
|---|---|---|---|
| 6,400,234 | B1 | 6/2002 | Ohhashi et al. |
| 2012/0097433 | A1 | 4/2012 | Kato et al. |
| 2020/0280117 | A1 | 9/2020 | Yosui |
| 2021/0351486 | A1 | 11/2021 | Baba |

FOREIGN PATENT DOCUMENTS

| | | | | |
|---|---|---|---|---|
| JP | 2001044716 | A | 2/2001 | |
| JP | 2010028306 | A | 2/2010 | |
| JP | 2012134551 | A | 7/2012 | |
| WO | 2019131286 | A1 | 7/2019 | |
| WO | WO-2020189699 | A1 * | 9/2020 | H05K 1/0221 |

OTHER PUBLICATIONS

International Search Report in PCT/JP2023/014706, mailed Jun. 20, 2023, 2 pages.
Written Opinion in PCT/JP2023/014706, mailed Jun. 20, 2023, 4 pages.

* cited by examiner

*Primary Examiner* — Andargie M Aychillhum
(74) *Attorney, Agent, or Firm* — Keating & Bennett, LLP

(57) ABSTRACT

In a multilayer substrate, one of a first reference conductor layer and a second reference conductor layer overlapping an eleventh interlayer connection conductor includes a first opening overlapping a signal conductor layer when viewed in a Z-axis direction. When viewed in the Z-axis direction, the first opening is positioned in a negative direction of an X axis relative to a vicinity of a first reference straight line connecting a second interlayer connection conductor and a fifth interlayer connection conductor. When viewed in the Z-axis direction, the first opening is positioned in a positive direction of the X axis relative to the eleventh interlayer connection conductor.

17 Claims, 13 Drawing Sheets

10

10

10b

10b

MULTILAYER SUBSTRATE

CROSS REFERENCE TO RELATED APPLICATIONS

This application claims the benefit of priority to Japanese Patent Application No. 2022-067996 filed on Apr. 18, 2022 and is a Continuation Application of PCT Application No. PCT/JP2023/014706 filed on Apr. 11, 2023. The entire contents of each application are hereby incorporated herein by reference.

BACKGROUND OF THE INVENTION

1. Field of the Invention

The present invention relates to multilayer substrates including signal conductor layers.

2. Description of the Related Art

As an invention related to a known multilayer substrate, for example, a transmission line described in Japanese Unexamined Patent Application Publication No. 2010-28306 has been known. The transmission line includes a signal line, two ground conductors, and multiple GND vias. The signal line is positioned between the two ground conductors in an up-down direction. The signal line extends in a front-back direction. The multiple GND vias electrically connect the two ground conductors. The multiple GND vias are positioned on both the left and the right of the signal line. The multiple GND vias are arranged along the signal line.

In the transmission line described in Japanese Unexamined Patent Application Publication No. 2010-28306, the multiple GND vias are spaced nonuniformly. Accordingly, the characteristic impedance produced in the signal line is also nonuniform. In this case, a propagation mode (hereinafter, an undesired propagation mode) other than a desired propagation mode (such as a TEM mode) occurs. As a result, a flow in an undesired propagation mode is produced in the two ground conductors. Such an undesired propagation mode results in noise radiation to the outside of the transmission line from a space between two GND vias, of the multiple GND vias, spaced widely. As a result, noise is generated in the transmission line.

SUMMARY OF THE INVENTION

Accordingly, example embodiments of the present invention provide multilayer substrates that are each able to reduce or prevent noise generation.

A multilayer substrate according to an example embodiment of the present invention includes a multilayer body including multiple insulator layers that are laminated in a Z-axis direction, a signal conductor layer in the multilayer body and with a linear shape extending in an X-axis direction orthogonal or substantially orthogonal to the Z-axis direction, a first reference conductor layer in the multilayer body, positioned in a positive direction of a Z axis relative to the signal conductor layer, and overlapping the signal conductor layer when viewed in the Z-axis direction, a second reference conductor layer in the multilayer body, positioned in a negative direction of the Z axis relative to the signal conductor layer, and overlapping the signal conductor layer when viewed in the Z-axis direction, a first interlayer connection conductor, a second interlayer connection conductor, and a third interlayer connection conductor electrically connecting the first reference conductor layer and the second reference conductor layer, positioned in a positive direction of a Y-axis orthogonal or substantially orthogonal to the X-axis direction and the Z-axis direction relative to the signal conductor layer, and arranged along the signal conductor layer in this order in a positive direction of an X axis, a fourth interlayer connection conductor, a fifth interlayer connection conductor, and a sixth interlayer connection conductor electrically connecting the first reference conductor layer and the second reference conductor layer, positioned in a negative direction of the Y axis relative to the signal conductor layer, and arranged along the signal conductor layer in this order in the positive direction of the X axis, and an eleventh interlayer connection conductor connected to the signal conductor layer, positioned in the positive direction of the Z axis relative to the signal conductor layer, and extending through at least one of the multiple insulator layers along the Z axis, wherein a distance between the second interlayer connection conductor and the third interlayer connection conductor in the X-axis direction is longer than a distance between the first interlayer connection conductor and the second interlayer connection conductor in the X-axis direction, a distance between the fifth interlayer connection conductor and the sixth interlayer connection conductor in the X-axis direction is longer than a distance between the fourth interlayer connection conductor and the fifth interlayer connection conductor in the X-axis direction, of the first reference conductor layer and the second reference conductor layer, the reference conductor layer overlapping the eleventh interlayer connection conductor includes a first opening overlapping the signal conductor layer when viewed in the Z-axis direction, when viewed in the Z-axis direction, the first opening is positioned in a negative direction of the X axis relative to a vicinity of the first reference straight line connecting the second interlayer connection conductor and the fifth interlayer connection conductor, and, when viewed in the Z-axis direction, the first opening is positioned in the positive direction of the X axis relative to the eleventh interlayer connection conductor.

With each the multilayer substrates according to example embodiments of the present invention, noise generation is able to be reduced or prevented.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Example Embodiments

Structure of Multilayer Substrate

Figure 1:
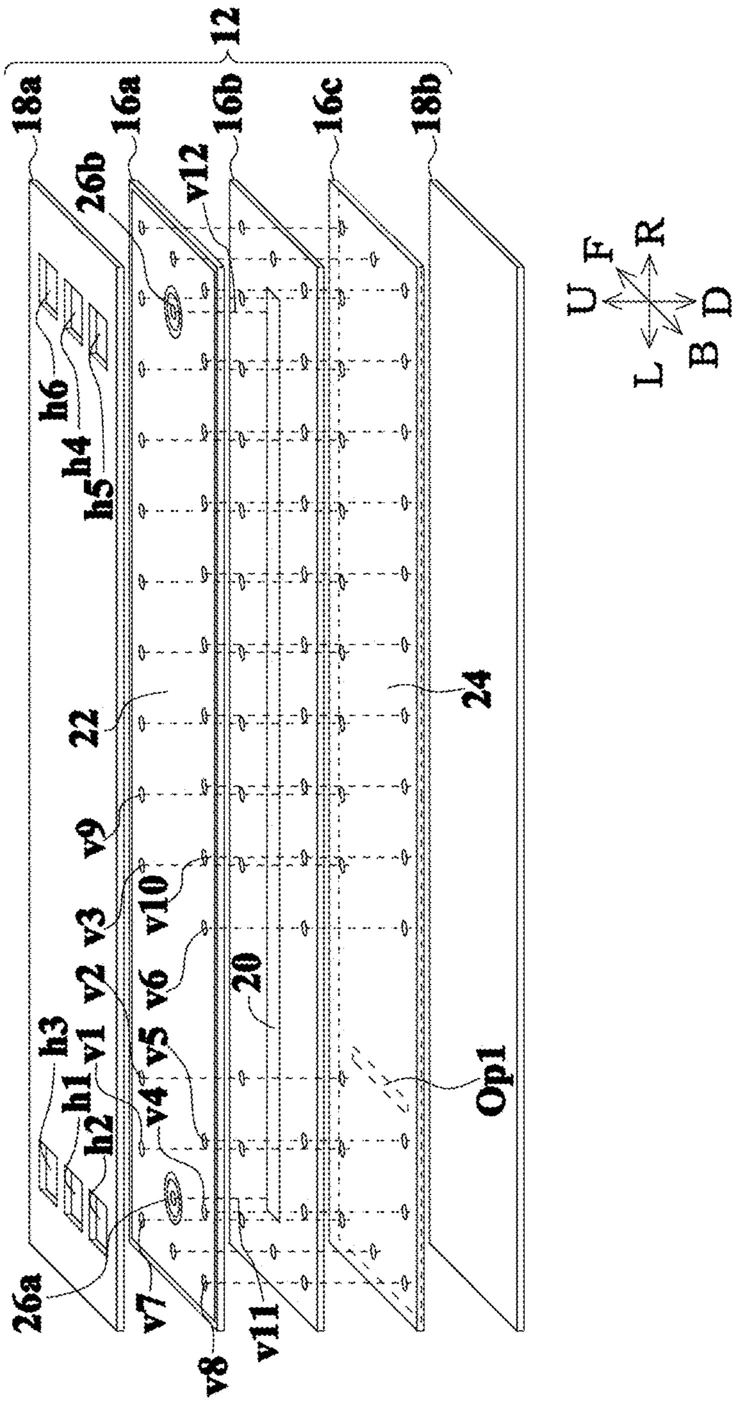
FIG. 1 is an exploded perspective view of a multilayer substrate 10 according to an example embodiment of the present invention.
Figure 2:
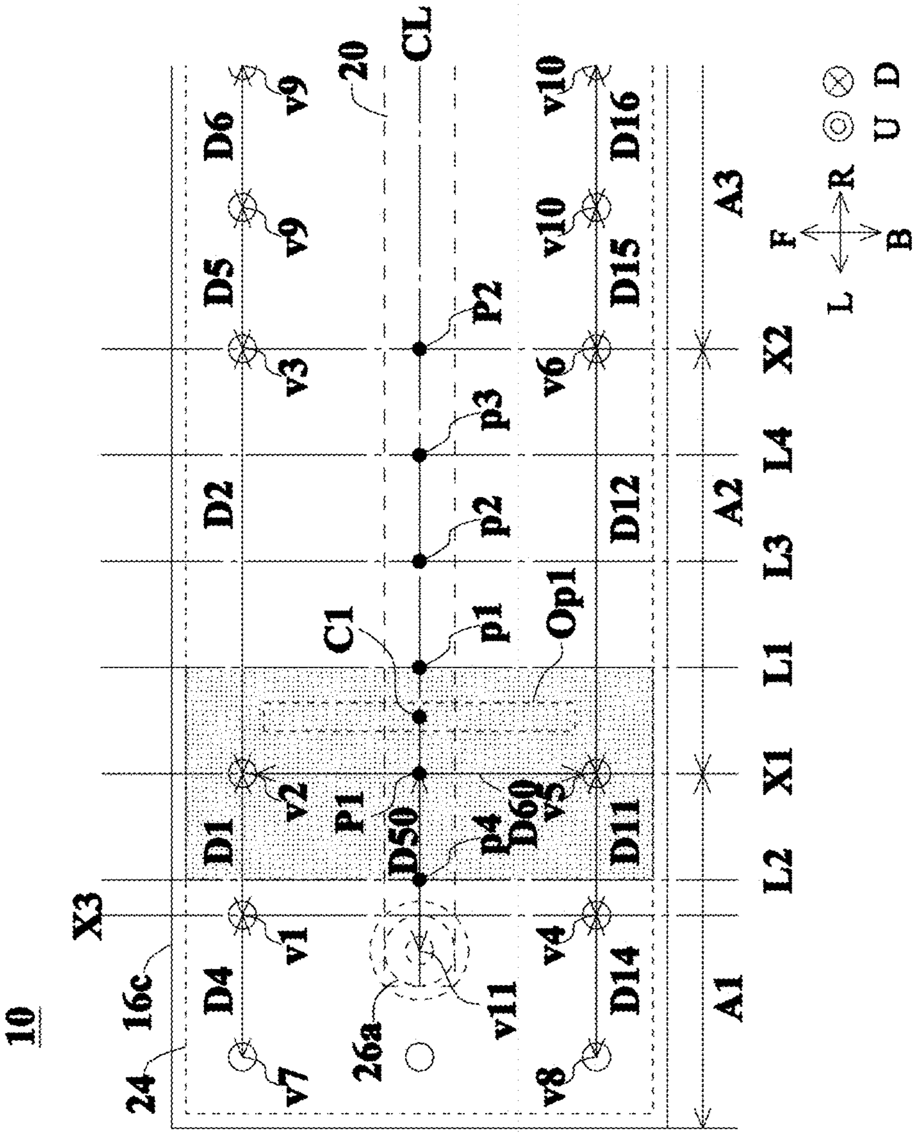
FIG. 2 is a top view of an insulator layer 16*c* of the multilayer substrate 10 according to an example embodiment of the present invention.
Figure 3:
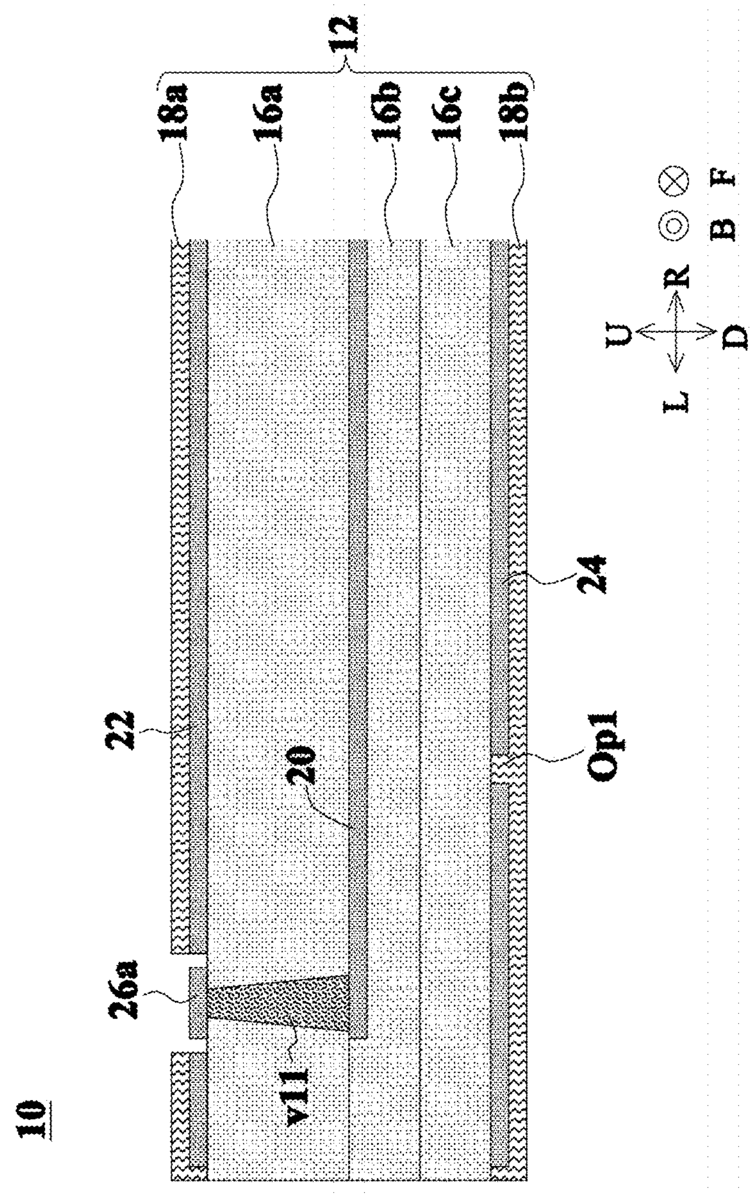
FIG. 3 is a sectional view of the multilayer substrate 10 according to an example embodiment of the present invention.
Figure 4:
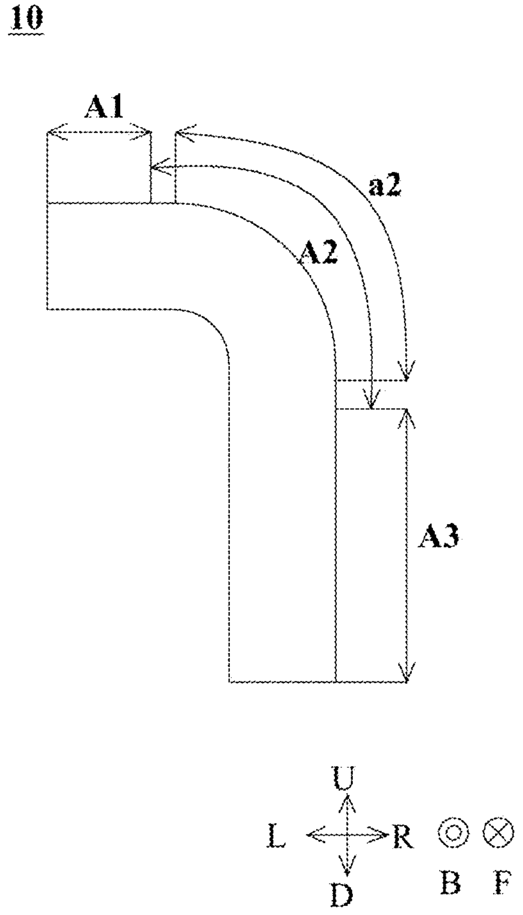
FIG. 4 is a front view of the multilayer substrate 10 according to an example embodiment of the present invention when in use.

Hereinafter, the structure of a multilayer substrate 10 according to an example embodiment of the present invention will be described with reference to the drawings. FIG. 1 is an exploded perspective view of the multilayer substrate 10. FIG. 2 is a top view of an insulator layer 16*c*. FIG. 2 illustrates a signal conductor layer 20 overlaying the insulator layer 16*c*. FIG. 3 is a sectional view of the multilayer substrate 10. FIG. 4 is a front view of the multilayer substrate 10 when in use.

In the present description, directions are defined as follows. An up-down direction is defined as the lamination direction of a multilayer body 12 of the multilayer substrate 10. The up-down direction also corresponds to a Z-axis direction. An up direction is a positive direction of the Z axis. A down direction is a negative direction of the Z axis. In addition, a left-right direction is defined as the direction where the signal conductor layer 20 of the multilayer substrate 10 extends. The left-right direction corresponds to an X-axis direction. A right direction is a positive direction of the X axis. A left direction is a negative direction of the X axis. In addition, a front-back direction is defined as the line width direction of the signal conductor layer 20 when viewed in the up-down direction. The front-back direction corresponds to a Y-axis direction. A front direction is a positive direction of the Y axis. A back direction is a negative direction of the Y axis. The up-down direction, the front-back direction, and the left-right direction are orthogonal or substantially orthogonal to one another. The up direction and the down direction of the up-down direction may be reversed, the left direction and the right direction of the left-right direction may be reversed, and the front direction and the back direction of the front-back direction may be reversed.

In the following description, X represents a component or a member of the multilayer substrate 10. In the present description, except where specifically noted, portions of X are defined as follows. A front portion of X means the front half of X. A back portion of X means the back half of X. A left portion of X means the left half of X. A right portion of X means the right half of X. An upper portion of X means the upper half of X. A lower portion of X means the lower half of X. A front end of X means the end of X in the front direction. A back end of X means the end of X in the back direction. A left end of X means the end of X in the left direction. A right end of X means the end of X in the right direction. An upper end of X means the end of X in the up direction. A lower end of X means the end of X in the down direction. A front end portion of X means the front end of X and the vicinity thereof. A back end portion of X means the back end of X and the vicinity thereof. A left end portion of X means the left end of X and the vicinity thereof. A right end portion of X means the right end of X and the vicinity thereof. An upper end portion of X means the upper end of X and the vicinity thereof. A lower end portion of X means the lower end of X and the vicinity thereof.

First, the structure of the multilayer substrate 10 will be described with reference to FIG. 1. The multilayer substrate 10 transmits a radio-frequency signal. The multilayer substrate 10 is used, for example, in an electronic device such as a smartphone, to electrically connect two circuits. As FIG. 1 illustrates, the multilayer substrate 10 includes the multilayer body 12, the signal conductor layer 20, a first reference conductor layer 22, a second reference conductor layer 24, signal terminals 26*a* and 26*b*, interlayer connection conductors v1 to v8, v11, and v12, multiple interlayer connection conductors v9, and multiple interlayer connection conductors v10.

The multilayer body 12 has a plate shape. Thus, the multilayer body 12 includes an upper main surface and a lower main surface. The upper main surface and the lower main surface of the multilayer body 12 each have a rectangular or substantially rectangular shape including long sides extending in the left-right direction. Thus, the length of the multilayer body 12 in the left-right direction is larger than the length of the multilayer body 12 in the front-back direction. The multilayer body 12 is flexible.

As FIG. 1 illustrates, the multilayer body 12 has a structure in which insulator layers 16*a* to 16*c* and protective layers 18*a* and 18*b* are laminated in the Z-axis direction. The protective layer 18*a*, the insulator layers 16*a* to 16*c*, and the protective layer 18*b* are arranged in this order from top to bottom. The insulator layers 16*a* to 16*c* each include an upper main surface and a lower main surface that are arranged in the up-down direction. A material for the insulator layers 16*a* to 16*c* is, for example, a thermoplastic resin. The thermoplastic resin is, for example, a liquid crystal polymer. Layers of the insulator layers 16*a* to 16*c* adjacent to each other in the up-down direction are mutually fused. The protective layers 18*a* and 18*b* will be described later.

A radio-frequency signal is transmitted to the signal conductor layer 20. The signal conductor layer 20 is provided in the multilayer body 12. In the present example embodiment, the signal conductor layer 20 is positioned on the upper main surface of the insulator layer 16*b*. The signal conductor layer 20 has a linear shape extending in the left-right direction (the X-axis direction).

The first reference conductor layer 22 is provided in the multilayer body 12 as FIG. 1 illustrates. The first reference conductor layer 22 is positioned above (in the positive Z-axis direction relative to) the signal conductor layer 20 and overlaps the signal conductor layer 20 when viewed in the up-down direction (the Z-axis direction). In the present example embodiment, the first reference conductor layer 22 is positioned on the upper main surface of the insulator layer 16*a*. The first reference conductor layer 22 covers the entire or substantially the entire upper main surface of the insulator layer 16*a*. A reference potential is connected to the first reference conductor layer 22. The reference potential is, for example, a ground potential.

The second reference conductor layer 24 is provided in the multilayer body 12 as FIG. 1 illustrates. The second reference conductor layer 24 is positioned below (in the negative Z-axis direction relative to) the signal conductor layer 20 and overlaps the signal conductor layer 20 when viewed in the up-down direction (the Z-axis direction). In the present example embodiment, the second reference conductor layer 24 is positioned on the lower main surface of the insulator layer 16*c*. The second reference conductor layer 24 covers the entire or substantially the entire lower main surface of the insulator layer 16*c*. A reference potential is connected to the second reference conductor layer 24. The reference potential is, for example, a ground potential. The signal conductor layer 20, the first reference conductor layer 22, and the second reference conductor layer 24 described above define a strip-line structure.

Of the first reference conductor layer 22 and the second reference conductor layer 24, the reference conductor layer overlapping the interlayer connection conductor v11 (an eleventh interlayer connection conductor) includes a first opening Op1 overlapping the signal conductor layer 20 when viewed in the up-down direction (the Z-axis direction). In the present example embodiment, the interlayer connection conductor v11 overlaps the second reference conductor layer 24 and does not overlap the first reference conductor layer 22. Thus, the second reference conductor layer 24 includes the first opening Op1 overlapping the signal conductor layer 20 when viewed in the up-down direction (the Z-axis direction). The structure of the first opening Op1 will be described later.

The signal terminal 26*a* is provided in a left end portion of the multilayer body 12. More specifically, the signal terminal 26*a* is positioned on the upper main surface of the multilayer body 12 (the main surface positioned in the positive Z-axis direction). The signal terminal 26*a* overlaps a left end portion of the signal conductor layer 20 when viewed in the up-down direction. The signal terminal 26*a* has a circular or substantially circular shape when viewed in the up-down direction. The signal terminal 26*a* is an external terminal which a radio-frequency signal is input to and output from. The signal terminal 26*a* is not in contact with the first reference conductor layer 22.

The interlayer connection conductor v11 (the eleventh interlayer connection conductor) electrically connects the signal terminal 26*a* and the left end portion of the signal conductor layer 20. The interlayer connection conductor v11 extends through the insulator layer 16*a* in the up-down direction. Since the signal terminal 26*b* and the interlayer connection conductor v12 have structures bilaterally symmetrical to the signal terminal 26*a* and the interlayer connection conductor v11, the description thereof will be omitted.

As FIG. 1 illustrates, the interlayer connection conductor v1 (a first interlayer connection conductor), the interlayer connection conductor v2 (a second interlayer connection conductor), the interlayer connection conductor v3 (a third interlayer connection conductor), the interlayer connection conductor v7 (a seventh interlayer connection conductor), and the multiple interlayer connection conductors v9 electrically connect the first reference conductor layer 22 and the second reference conductor layer 24. As FIG. 2 illustrates, the interlayer connection conductor v1 (the first interlayer connection conductor), the interlayer connection conductor v2 (the second interlayer connection conductor), the interlayer connection conductor v3 (the third interlayer connection conductor), the interlayer connection conductor v7 (the seventh interlayer connection conductor), and the multiple interlayer connection conductors v9 are positioned in front of (in the positive Y-axis direction relative to) the signal conductor layer 20. The interlayer connection conductor v7, the interlayer connection conductor v1 (the first interlayer connection conductor), the interlayer connection conductor v2 (the second interlayer connection conductor), the interlayer connection conductor v3 (the third interlayer connection conductor), and the multiple interlayer connection conductors v9 are arranged along the signal conductor layer 20 in this order in the right direction (the positive X-axis direction).

A distance D2 between the interlayer connection conductor v2 (the second interlayer connection conductor) and the interlayer connection conductor v3 (the third interlayer connection conductor) in the left-right direction (the X-axis direction) is longer than a distance D1 between the interlayer connection conductor v1 (the first interlayer connection conductor) and the interlayer connection conductor v2 (the second interlayer connection conductor) in the left-right direction (the X-axis direction). A distance D4 between the interlayer connection conductor v7 and the interlayer connection conductor v1 in the left-right direction is shorter than the distance D2 between the interlayer connection conductor v2 and the interlayer connection conductor v3 in the left-right direction. A distance D5 between the leftmost interlayer connection conductor v9 of the multiple interlayer connection conductors v9 and the interlayer connection conductor v3 in the left-right direction is shorter than the distance D2 between the interlayer connection conductor v2 and the interlayer connection conductor v3 in the left-right direction. In addition, a spacing D6 of the multiple interlayer connection conductors v9 in the left-right direction is shorter than the distance D2 between the interlayer connection conductor v2 and the interlayer connection conductor v3 in the left-right direction. In the present example embodiment, the distance D1, the distance D4, the distance D5, and the distance D6 are equal or substantially equal to one another.

As FIG. 1 illustrates, the interlayer connection conductor v4 (a fourth interlayer connection conductor), the interlayer connection conductor v5 (a fifth interlayer connection conductor), the interlayer connection conductor v6 (a sixth interlayer connection conductor), the interlayer connection conductor v8 (an eighth interlayer connection conductor), and the multiple interlayer connection conductors v10 electrically connect the first reference conductor layer 22 and the second reference conductor layer 24. As FIG. 2 illustrates, the interlayer connection conductor v4 (the fourth interlayer connection conductor), the interlayer connection conductor v5 (the fifth interlayer connection conductor), the interlayer connection conductor v6 (the sixth interlayer connection conductor), the interlayer connection conductor v8 (the eighth interlayer connection conductor), and the multiple interlayer connection conductors v10 are positioned behind (in the negative Y-axis direction relative to) the signal conductor layer 20. The interlayer connection conductor v8, the interlayer connection conductor v4 (the fourth interlayer connection conductor), the interlayer connection conductor v5 (the fifth interlayer connection conductor), the interlayer connection conductor v6 (the sixth interlayer connection conductor), and the multiple interlayer connection conductors v10 are arranged along the signal conductor layer 20 in this order in the right direction (the positive X-axis direction).

A distance D12 between the interlayer connection conductor v5 (the fifth interlayer connection conductor) and the interlayer connection conductor v6 (the sixth interlayer connection conductor) in the left-right direction (the X-axis direction) is longer than a distance D11 between the interlayer connection conductor v4 (the fourth interlayer connection conductor) and the interlayer connection conductor v5 (the fifth interlayer connection conductor) in the left-right direction (the X-axis direction). A distance D14 between the interlayer connection conductor v8 and the interlayer connection conductor v4 in the left-right direction is shorter than the distance D12 between the interlayer connection conductor v5 and the interlayer connection conductor v6 in the left-right direction. A distance D15 between the leftmost interlayer connection conductor v10 of the multiple interlayer connection conductors v10 and the interlayer connection conductor v6 in the left-right direction is shorter than the distance D12 between the interlayer connection conductor v5 and the interlayer connection conductor v6 in the left-right direction. In addition, a spacing D16 of the multiple interlayer connection conductors v10 in the left-right direction is shorter than the distance D12 between the interlayer connection conductor v5 and the interlayer connection conductor v6 in the left-right direction. In the present example embodiment, the distance D11, the distance D14, the distance D15, and the distance D16 are equal or substantially equal to one another.

In the present example embodiment, the interlayer connection conductor v1 overlaps the interlayer connection conductor v4 when viewed in the front-back direction. The interlayer connection conductor v2 overlaps the interlayer connection conductor v5 when viewed in the front-back direction. The interlayer connection conductor v3 overlaps the interlayer connection conductor v6 when viewed in the front-back direction. The interlayer connection conductor v7 overlaps the interlayer connection conductor v8 when viewed in the front-back direction. The multiple interlayer connection conductors v9 overlap the respective multiple interlayer connection conductors v10.

However, the interlayer connection conductor v1 does not necessarily overlap the interlayer connection conductor v4 when viewed in the front-back direction. The interlayer connection conductor v2 does not necessarily overlap the interlayer connection conductor v5 when viewed in the front-back direction. The interlayer connection conductor v3 does not necessarily overlap the interlayer connection conductor v6 when viewed in the front-back direction. The interlayer connection conductor v7 does not necessarily overlap the interlayer connection conductor v8 when viewed in the front-back direction. The multiple interlayer connection conductors v9 do not necessarily overlap the respective multiple interlayer connection conductors v10.

In addition, as FIG. 2 illustrates, the interlayer connection conductor v11 (the eleventh interlayer connection conductor) is positioned in a section surrounded by the interlayer connection conductor v1 (the first interlayer connection conductor), the interlayer connection conductor v2 (the second interlayer connection conductor), the interlayer connection conductor v4 (the fourth interlayer connection conductor), the interlayer connection conductor v5 (the fifth interlayer connection conductor), the interlayer connection conductor v7 (the seventh interlayer connection conductor), and the interlayer connection conductor v8 (the eighth interlayer connection conductor). A distance D50 between the interlayer connection conductor v11 and a first reference straight line X1 (described later) in the left-right direction is shorter than half the wavelength of the radio-frequency signal transmitted through the signal conductor layer 20. In addition, as FIG. 3 illustrates, the interlayer connection conductor v11 does not overlap the first opening Op1, which will described later, when viewed in the up-down direction.

The first reference conductor layer 22, the second reference conductor layer 24, and the signal terminals 26*a* and 26*b* described above are each formed by, for example, etching metal foil provided on a corresponding one of the upper main surfaces and the lower main surfaces of the insulator layers 16*a* to 16*c*. The metal foil is, for example, copper foil.

In addition, the interlayer connection conductors v1 to v8, v11, and v12 and the multiple interlayer connection conductors v9 and v10 are, for example, via hole conductors. The via hole conductors are manufactured by forming through holes in the insulator layers 16*a* to 16*c*, by filling the through holes with conductive paste, and by sintering the conductive paste. The material for the interlayer connection conductors v1 to v8, v11, and v12 and the multiple interlayer connection conductors v9 and v10 is, for example, a mixture of resin and metal.

Here, the first reference straight line X1 is a line connecting the interlayer connection conductor v2 (the second interlayer connection conductor) and the interlayer connection conductor v5 (the fifth interlayer connection conductor). A first intersection point P1 is defined as the intersection point of the first reference straight line X1 and a center line CL of the signal conductor layer 20 when viewed in the up-down direction (the Z-axis direction).

In addition, a second reference straight line X2 is a line extending through the interlayer connection conductor v3 (the third interlayer connection conductor) and the interlayer connection conductor v6 (the sixth interlayer connection conductor). A second intersection point P2 is defined as the intersection point of the second reference straight line X2 and the center line CL of the signal conductor layer 20 when viewed in the up-down direction (the Z-axis direction).

In addition, a section between the first intersection point P1 and the second intersection point P2 is divided into quarters by a first point p1, a second point p2, and a third point p3 that are arranged in the right direction (the positive X-axis direction). Moreover, a fourth point p4 is defined as a point spaced apart from the first intersection point P1 in the left direction (the negative X-axis direction) by a distance equal or substantially equal to the distance between the first point p1 and the second point p2.

Hereinafter, the structure of the first opening Op1 will be described. The first opening Op1 has a slit shape extending in the front-back direction. Thus, the width of the first opening Op1 in the front-back direction (the Y-axis direction) is larger than the width of the first opening Op1 in the left-right direction (the X-axis direction). The width of the first opening Op1 in the front-back direction (the Y-axis direction) is more than or equal to half a distance D60 between a back end (the end in the negative Y-axis direction) of the interlayer connection conductor v2 (the second interlayer connection conductor) and a front end (the end in the positive Y-axis direction) of the interlayer connection conductor v5 (the fifth interlayer connection conductor) in the front-back direction (the Y-axis direction).

In addition, the first opening Op1 is positioned in the vicinities of the interlayer connection conductors v2 and v5. More specifically, when viewed in the up-down direction (the Z-axis direction), the first opening Op1 is positioned on the right of (in the negative X-axis direction relative to) the vicinity of the first reference straight line X1 connecting the second interlayer connection conductor v2 and the fifth interlayer connection conductor v5. "Being positioned in the vicinity of the first reference straight line X1" means being positioned on the left of a first straight line L1 and on the right of a second straight line L2.

The first straight line L1 is a line extending through the first point p1 and orthogonal or substantially orthogonal to the signal conductor layer 20. The second straight line L2 is a line extending through the fourth point p4 and orthogonal or substantially orthogonal to the signal conductor layer 20. When viewed in the up-down direction (the Z-axis direction), a center C1 of the first opening Op1 in the front-back direction and in the left-right direction (the X-axis direction) is positioned between the first straight line L1 and the second straight line L2. In the present example embodiment, when viewed in the up-down direction (the Z-axis direction), the first opening Op1 is positioned between the first straight line L1 and the second straight line L2.

In addition, when viewed in the up-down direction (the Z-axis direction), the first opening Op1 is positioned on the right of (in the positive X-axis direction relative to) the interlayer connection conductor v11 (the eleventh interlayer connection conductor). Moreover, when viewed in the up-down direction (the Z-axis direction), a left end (the end in the negative X-axis direction) of the first opening Op1 is positioned on the right of (in the positive X-axis direction relative to) a straight line X3 connecting the interlayer connection conductor v1 (the first interlayer connection conductor) and the interlayer connection conductor v4 (the fourth interlayer connection conductor). In the present example embodiment, when viewed in the up-down direction (the Z-axis direction), the left end (the end in the negative X-axis direction) of the first opening Op1 is positioned on the right of (in the positive X-axis direction relative to) a right end (the end in the positive X-axis direction) of the interlayer connection conductor v1 (the first interlayer connection conductor) and a right end (the end in the positive X-axis direction) of the interlayer connection conductor v4 (the fourth interlayer connection conductor).

When viewed in the up-down direction (the Z-axis direction), a right end (the end in the positive X-axis direction) of the first opening Op1 is positioned on the left of (in the negative X-axis direction relative to) a third straight line L3 extending through the second point p2 and orthogonal or substantially orthogonal to the signal conductor layer 20. In the present example embodiment, when viewed in the up-down direction (the Z-axis direction), the entire or substantially the entire first opening Op1 is positioned between the first straight line L1 and the second straight line L2. More precisely, the first opening Op1 is positioned between the first reference straight line X1 and the first straight line L1.

In addition, a front end (the end in the positive Y-axis direction) of the first opening Op1 is positioned behind (in the negative Y-axis direction relative to) a front end (the end in the positive Y-axis direction) of the interlayer connection conductor v2 (the second interlayer connection conductor). A back end (the end in the negative Y-axis direction) of the first opening Op1 is positioned in front of (in the positive Y-axis direction relative to) a back end (the end in the negative Y-axis direction) of the interlayer connection conductor v5 (the fifth interlayer connection conductor).

In addition, when viewed in the up-down direction (the Z-axis direction), the first opening Op1 and an opening other than the first opening Op1 do not exist on the third straight line L3. That is, there is no opening on the third straight line L3. Moreover, no opening is provided on the right of the first opening Op1 and on the left of the second reference straight line X2.

As described above, the first reference conductor layer 22 provided at the same or substantially the same position as the position of the signal terminal 26*a* in the up-down direction includes no opening. The second reference conductor layer 24 provided at a different position from the position of the signal terminal 26*a* in the up-down direction includes the first opening Op1.

In addition, the multilayer substrate 10 includes no opening in a section between the first straight line L1 and the second reference straight line X2. A fourth straight line L4 is a line extending through the third point p3 and orthogonal or substantially orthogonal to the signal conductor layer 20.

The protective layer 18*a* is an insulator layer covering the upper main surface of the insulator layer 16*a*. Thus, the protective layer 18*a* protects the first reference conductor layer 22. However, the protective layer 18*a* includes openings h1 to h6. The opening h1 overlaps the signal terminal 26*a* when viewed in the up-down direction. Thus, the signal terminal 26*a* is exposed outside from the multilayer substrate 10. The opening h2 is positioned behind the opening h1. A portion of the first reference conductor layer 22 is exposed outside from the multilayer substrate 10 through the opening h2. The opening h3 is positioned in front of the opening h1. A portion of the first reference conductor layer 22 is exposed outside from the multilayer substrate 10 through the opening h3. Thus, such a portion of the first reference conductor layer 22 defines and functions as a ground terminal. Since openings h4 to h6 have structures bilaterally symmetrical to the openings h1 to h3, the description thereof will be omitted.

The protective layer 18*b* is a protective layer covering the lower main surface of the insulator layer 16*c*. Thus, the protective layer 18*b* protects the second reference conductor layer 24.

The multilayer substrate 10 described above is flexible. Thus, as FIG. 4 illustrates, the multilayer substrate 10 is bendable. Specifically, the multilayer substrate 10 includes a first section A1, a second section A2, and a third section A3. The first section A1, the second section A2, and the third section A3 are arranged in this order from left to right with the multilayer substrate 10 not being bent. As FIG. 2 illustrates, the first section A1 is a section on the left of the first reference straight line X1 connecting the interlayer connection conductor v2 and the interlayer connection conductor v5. The second section A2 is a section between the first reference straight line X1 connecting the interlayer connection conductor v2 and the interlayer connection conductor v5 and the second reference straight line X2 connecting the interlayer connection conductor v3 and the interlayer connection conductor v6. The third section A3 is a section on the right of the second reference straight line X2 connecting the interlayer connection conductor v3 and the interlayer connection conductor v6.

A portion a2 of the second section A2 is bent in the down direction relative to the first section A1. That is, the multilayer substrate 10 is bent at the portion a2 of the second section A2 between the first reference straight line X1 connecting the interlayer connection conductor v2 (the second interlayer connection conductor) and the interlayer connection conductor v5 (the fifth interlayer connection conductor) and the second reference straight line X2 connecting the interlayer connection conductor v3 (the third interlayer connection conductor) and the interlayer connection conductor v6 (the sixth interlayer connection conductor). An end of the portion a2 in the negative X-axis direction is positioned in the positive X-axis direction relative to an end of the second section A2 in the negative X-axis direction. An end of the portion a2 in the positive X-axis direction is positioned in the negative X-axis direction relative to an end of the second section A2 in the positive X-axis direction. On the other hand, the first section A1 and the third section A3 are not bent. However, the first section A1 and the third section A3 may be bent slightly. In this case, the curvature radius of the first section A1 and the curvature radius of the third section A3 are each larger than the curvature radius of the portion a2 of the second section A2.

Advantageous Effects (a) According to the multilayer substrate 10, noise generation can be reduced or prevented. More specifically, in the multilayer substrate 10, the distance D2 between the interlayer connection conductor v2 and the interlayer connection conductor v3 in the left-right direction is longer than the distance D1 between the interlayer connection conductor v1 and the interlayer connection conductor v2 in the left-right direction. The distance D12 between the interlayer connection conductor v5 and the interlayer connection conductor v6 in the left-right direction is longer than the distance D11 between the interlayer connection conductor v4 and the interlayer connection conductor v5 in the left-right direction. Thus, the characteristic impedance produced in the signal conductor layer 20 is likely to be nonuniform. In this case, a propagation mode (hereinafter, an undesired propagation mode) other than a desired propagation mode (TEM mode) occurs. Consequently, the undesired propagation mode may result in noise radiation from a region between the first reference straight line X1 and the second reference straight line X2.

Thus, in the multilayer substrate 10, when viewed in the up-down direction, the first opening Op1 is positioned on the left of the vicinity of the first reference straight line X1 connecting the second interlayer connection conductor v2 and the fifth interlayer connection conductor v5. In addition, when viewed in the up-down direction, the first opening Op1 is positioned on the right of the eleventh interlayer connection conductor v11. Thus, the first opening Op1 is positioned in the vicinities of the interlayer connection conductors v2 and v5. The center C1 of the first opening Op1 is positioned, in the left-right direction, in the vicinity of the first reference straight line X1 and is not positioned in the vicinities of the interlayer connection conductors v2 and v5. Thus, even if a flow in the undesired propagation mode moves in the second reference conductor layer 24 in the right direction, the flow in the undesired propagation mode is blocked by the first opening Op1. Thus, the undesired propagation mode is reduced or prevented from resulting in noise radiation from the region between the first reference straight line X1 and the second reference straight line X2. Moreover, undesired resonance due to the undesired propagation mode is reduced or prevented.

(b) According to the multilayer substrate 10, the width of the first opening Op1 in the front-back direction is more than or equal to about half the distance D60 in the front-back direction between a back end of the interlayer connection conductor v2 and a front end of the interlayer connection conductor v5. Thus, the flow in the undesired propagation mode through the second reference conductor layer 24 is efficiently impeded by the first opening Op1. Accordingly, the undesired propagation mode is reduced or prevented from resulting in noise radiation from a space between the interlayer connection conductor v2 and the interlayer connection conductor v3 and a space between the interlayer connection conductor v5 and the interlayer connection conductor v6. In addition, no opening is provided on the right of the first opening Op1 and on the left of the second reference straight line X2, and the strength of the multilayer substrate 10 can thus be maintained.

(c) The multilayer substrate 10 is bent at the portion a2 of the second section A2 between the first reference straight line X1 connecting the interlayer connection conductor v2 and the interlayer connection conductor v5 and the second reference straight line X2 connecting the interlayer connection conductor v3 and the interlayer connection conductor v6. No interlayer connection conductor exists in the portion a2 of the second section A2. Thus, even when the portion a2 of the second section A2 is bent, in the portion a2 of the second section A2, the distance between the signal conductor layer 20 and each of the interlayer connection conductors hardly varies. As a result, in the portion a2 of the second section A2, the characteristic impedance produced in the signal conductor layer 20 hardly varies. Thus, according to the multilayer substrate 10, the characteristic impedance produced in the signal conductor layer 20 is reduced or prevented from varying from a desired characteristic impedance (for example, 50Ω).

(d) In the multilayer substrate 10, the width of the first opening Op1 in the front-back direction is larger than the width of the first opening Op1 in the left-right direction. That is, the first opening Op1 has a longitudinal direction in the front-back direction. Thus, the first opening Op1 impedes the flow in the undesired propagation mode in the right direction. Moreover, since the width of the first opening Op1 in the left-right direction is small, the area of the first opening Op1 is not excessively increased. As a result, noise is reduced or prevented from being radiated from the first opening Op1. In addition, the strength of the multilayer substrate 10 can be maintained.

(e) In the multilayer substrate 10, the front end of the first opening Op1 is positioned behind a front end of the interlayer connection conductor v2. The back end of the first opening Op1 is positioned in front of a back end of the interlayer connection conductor v5. Thus, the length of the first opening Op1 in the front-back direction is not excessively increased. As a result, the strength of the second reference conductor layer 24 is hardly reduced, and breakage of the second reference conductor layer 24 is reduced or prevented. In addition, the strength of the multilayer substrate 10 can be maintained.

(f) According to the multilayer substrate 10, noise generation can be reduced or prevented. More specifically, the characteristic impedance produced in the interlayer connection conductor v11 and the sections in front of and behind the interlayer connection conductor v11 is likely to vary from the desired characteristic impedance. Thus, an undesired propagation mode is likely to occur in the interlayer connection conductor v11. Accordingly, in the vicinity of the first reference straight line X1, the flow in the undesired propagation mode moves in the second reference conductor layer 24 in the right direction.

Thus, the interlayer connection conductor v11 is positioned in a section in which the interlayer connection conductor v1, the interlayer connection conductor v2, the interlayer connection conductor v4, the interlayer connection conductor v5, the interlayer connection conductor v7, and the interlayer connection conductor v8 are provided. Consequently, the interlayer connection conductor v1, the interlayer connection conductor v2, the interlayer connection conductor v4, the interlayer connection conductor v5, the interlayer connection conductor v7, and the interlayer connection conductor v8 reduce or prevent the undesired propagation mode from resulting in noise radiation to the outside of the multilayer substrate 10.

First Modification

Figure 5:
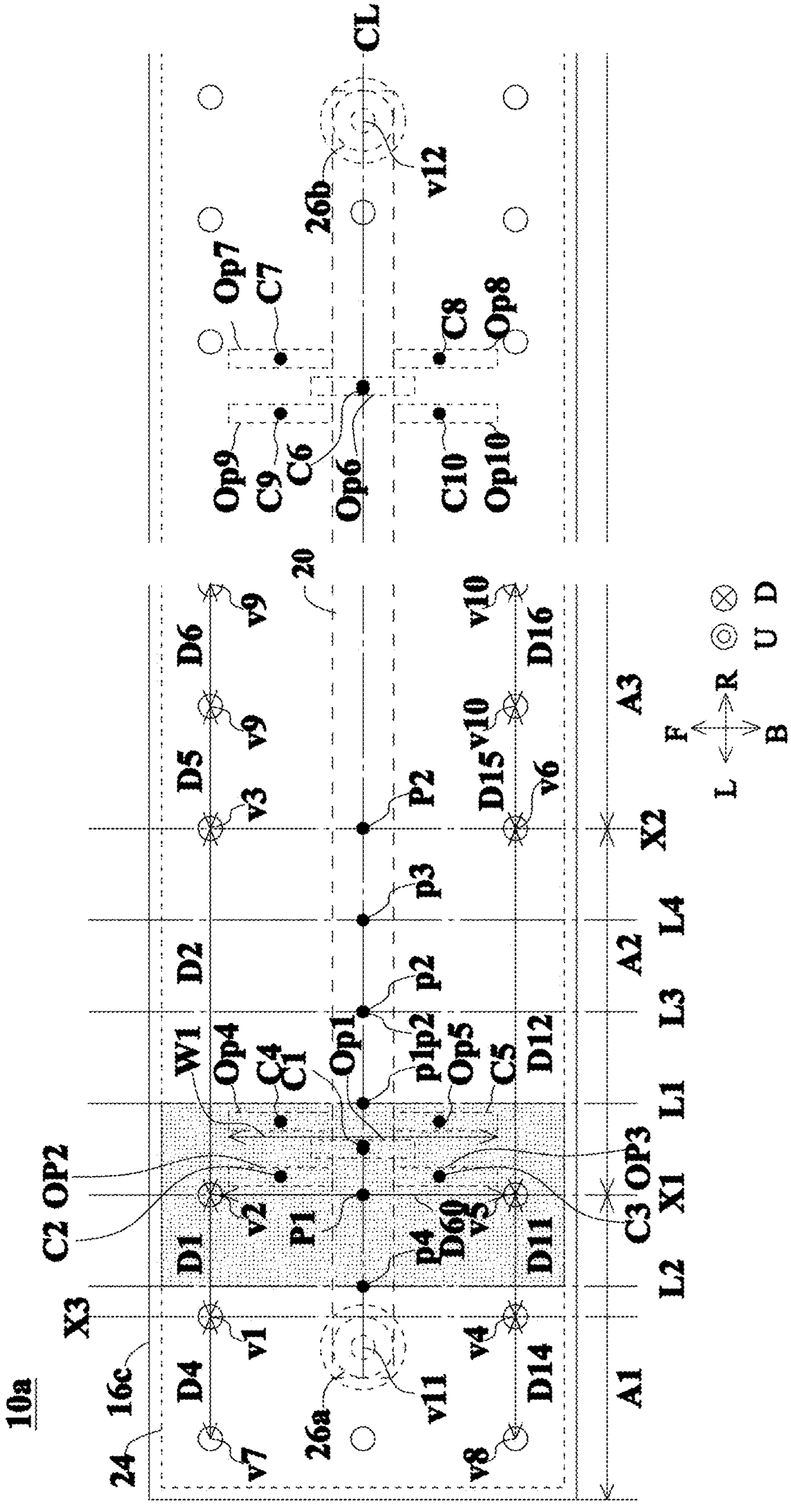
FIG. 5 is a top view of the insulator layer 16*c*.

Hereinafter, a multilayer substrate 10*a* according to a first modification of an example embodiment of the present invention will be described with reference to the drawings. FIG. 5 is a top view of the insulator layer 16*c*.

The multilayer substrate 10*a* differs from the multilayer substrate 10 in that second openings Op2 to Op5, a third opening Op6, and fourth openings Op7 to Op10 are provided in the second reference conductor layer 24. The second opening Op2 is positioned on the left front of the first opening Op1. The second opening Op3 is positioned on the left back of the first opening Op1. The second opening Op4 is positioned on the right front of the first opening Op1. The second opening Op5 is positioned on the right back of the first opening Op1. In addition, when viewed in the left-right direction, a front end portion of the first opening Op1 overlaps a back end portion of the second opening Op2 and a back end portion of the second opening Op4. When viewed in the left-right direction, a back end portion of the first opening Op1 overlaps a front end portion of the second opening Op3 and a front end portion of the second opening Op5. In each of the second openings Op2 to Op5, the width thereof in the front-back direction is larger than the width thereof in the left-right direction.

However, the second openings Op2 to Op5 are positioned between the first straight line L1 and the second straight line L2. In the present example embodiment, centers C2 to C5 of the second openings Op2 to Op5 in the left-right direction (the X-axis direction) are positioned between the first straight line L1 and the second straight line L2. Moreover, when viewed in the left-right direction (the X-axis direction), a width W1, in the front-back direction (the Y-axis direction), of a region in which the first opening Op1 and the second openings Op2 to Op5 exist is more than or equal to half the distance D60 between the back end (the end in the negative Y-axis direction) of the interlayer connection conductor v2 (the second interlayer connection conductor) and the front end (the end in the positive Y-axis direction) of the interlayer connection conductor v5 (the fifth interlayer connection conductor) in the front-back direction (the Y-axis direction).

The third opening Op6 and the fourth openings Op7 to Op10 are positioned in the vicinity of the interlayer connection conductor v12. The third opening Op6 has a structure bilaterally symmetrical to the first opening Op1. In addition, the structures of the fourth openings Op7 to Op10 have structures bilaterally symmetrical to the second openings Op2 to Op5. Thus, the description of the structures of the third opening Op6 and the fourth openings Op7 to Op10 will be omitted. With the configuration, noise generated due to the interlayer connection conductor v12 is reduced or prevented from being radiated. In addition, since there is no opening between the first straight line L1 and the fourth straight line L4, noise leaking can be reduced or prevented, and the strength of the multilayer substrate 10*a* can be maintained. The structures of the other portions of the multilayer substrate 10*a* are the same or substantially the same as those of the multilayer substrate 10, and the description thereof will thus be omitted. The multilayer substrate 10*a* can provide the advantageous effects (a), (c), (d), (e), and (f) described above.

(g) According to the multilayer substrate 10*a*, when viewed in the left-right direction, the width W1, in the front-back direction, of the region in which the first opening Op1 and the second openings Op2 to Op5 exist is more than or equal to about half the distance D60 between the back end of the interlayer connection conductor v2 and the front end of the interlayer connection conductor v5. Thus, the flow in the undesired propagation mode propagating through the second reference conductor layer 24 is impeded efficiently by the first opening Op1 and the second openings Op2 to Op5. Accordingly, the undesired propagation mode is reduced or prevented from resulting in noise radiation from the space between the interlayer connection conductor v2 and the interlayer connection conductor v3 and the space between the interlayer connection conductor v5 and the interlayer connection conductor v6.

(h) In the multilayer substrate 10*a*, the third opening Op6 and the first opening Op1 have structures symmetrical to each other about the third straight line L3. In addition, the fourth openings Op7 to Op10 and the second openings Op2 to Op5 have structures symmetrical to each other about the third straight line L3. Thus, even if a flow in the undesired propagation mode moves, in the vicinity of the second reference straight line X2, in the second reference conductor layer 24 in the left direction, the flow in the undesired propagation mode is impeded by the third opening Op6 and the fourth openings Op7 to Op10. Accordingly, the undesired propagation mode is reduced or prevented from resulting in noise radiation from the space between the interlayer connection conductor v2 and the interlayer connection conductor v3 and the space between the interlayer connection conductor v5 and the interlayer connection conductor v6.

Second Modification

Figure 6:
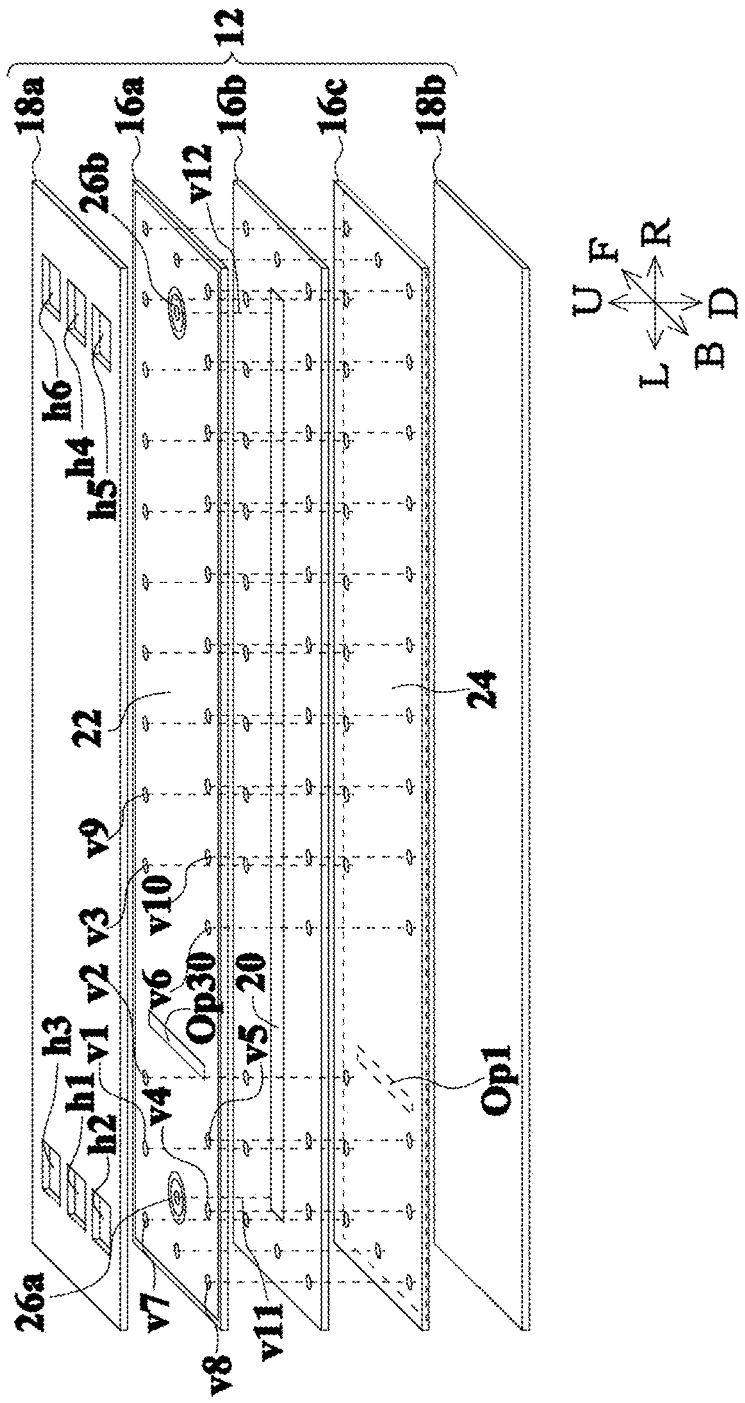
FIG. 6 is an exploded perspective view of a multilayer substrate 10*b* according to an example embodiment of the present invention.
Figure 7:
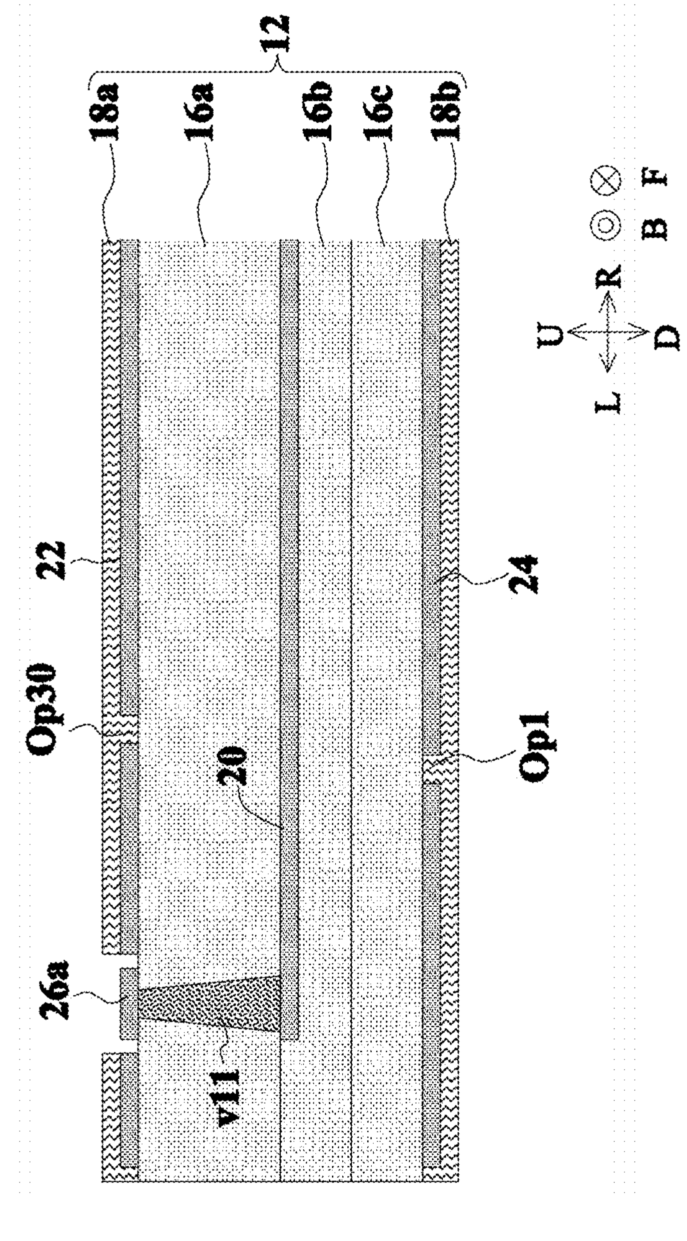
FIG. 7 is a sectional view of the multilayer substrate 10*b* according to an example embodiment of the present invention.

Hereinafter, a multilayer substrate 10*b* according to a second modification of an example embodiment of the present invention will be described with reference to the drawings. FIG. 6 is an exploded perspective view of the multilayer substrate 10*b*. FIG. 7 is a sectional view of the multilayer substrate 10*b*.

The multilayer substrate 10*b* differs from the multilayer substrate 10 in that an opening Op30 is provided in the first reference conductor layer 22. The opening Op30 does not overlap the first opening Op1 when viewed in the up-down direction. Thus, the characteristic impedance produced in the signal conductor layer 20 hardly varies. In addition, the first opening Op1 is positioned closer to the interlayer connection conductor v11 than the opening Op30, and an influence of noise is reduced or prevented. The structures of the other portions of the multilayer substrate 10*b* are the same or substantially the same as those of the multilayer substrate 10, and the description thereof will thus be omitted. The multilayer substrate 10*b* can provide the advantageous effects (a) to (f) described above. In addition, according to the multilayer substrate 10*b*, the characteristic impedance produced in the signal conductor layer 20 is reduced or prevented from varying from the desired characteristic impedance.

Third Modification

Figure 8:
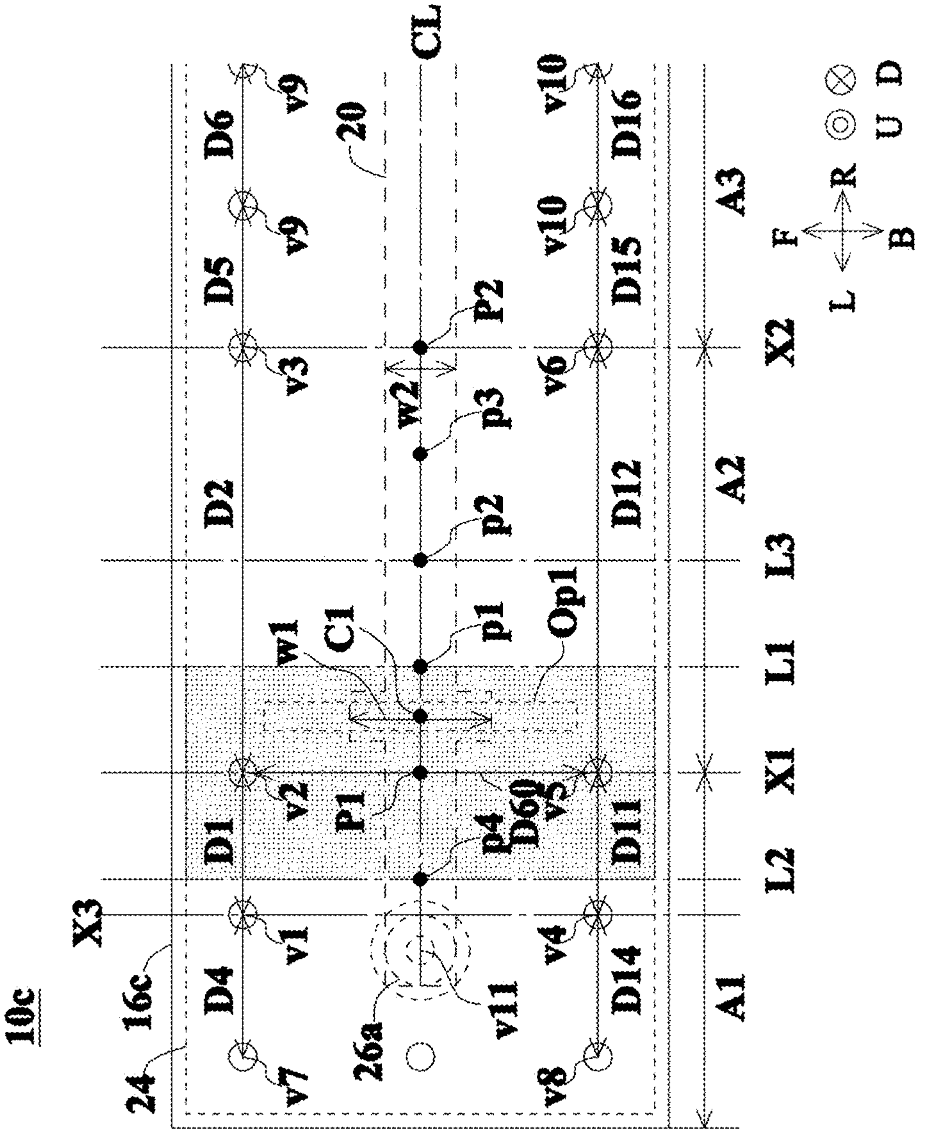
FIG. 8 is a top view of the insulator layer 16*c*.

Hereinafter, a multilayer substrate 10*c* according to a third modification of an example embodiment of the present invention will be described with reference to the drawings. FIG. 8 is a top view of the insulator layer 16*c*.

The multilayer substrate 10*c* differs from the multilayer substrate 10 in that a line width w1 of a portion of the signal conductor layer 20 overlapping the first opening Op1 when viewed in the up-down direction is larger than a line width w2 of a portion of the signal conductor layer 20 not overlapping the first opening Op1. The structures of the other parts of the multilayer substrate 10*c* are the same as those of the multilayer substrate 10, and the description thereof will thus be omitted. The multilayer substrate 10*c* can provide the advantageous effects (a) to (f) described above.

In addition, the characteristic impedance produced in the signal conductor layer 20 is reduced or prevented from varying from the desired characteristic impedance. More specifically, in the portion of the signal conductor layer 20 overlapping the first opening Op1 when viewed in the up-down direction, capacitance is hardly generated between the signal conductor layer 20 and the second reference conductor layer 24. Consequently, the characteristic impedance produced in the portion of the signal conductor layer 20 overlapping the first opening Op1 when viewed in the up-down direction is likely to be higher than the desired characteristic impedance.

Thus, the line width w1 of the portion of the signal conductor layer 20 overlapping the first opening Op1 when viewed in the up-down direction is larger than the line width w2 of the portion of the signal conductor layer 20 not overlapping the first opening Op1 when viewed in the up-down direction. The characteristic impedance produced in the portion of the signal conductor layer 20 overlapping the first opening Op1 when viewed in the up-down direction becomes close to the desired characteristic impedance.

Fourth Modification

Figure 9:
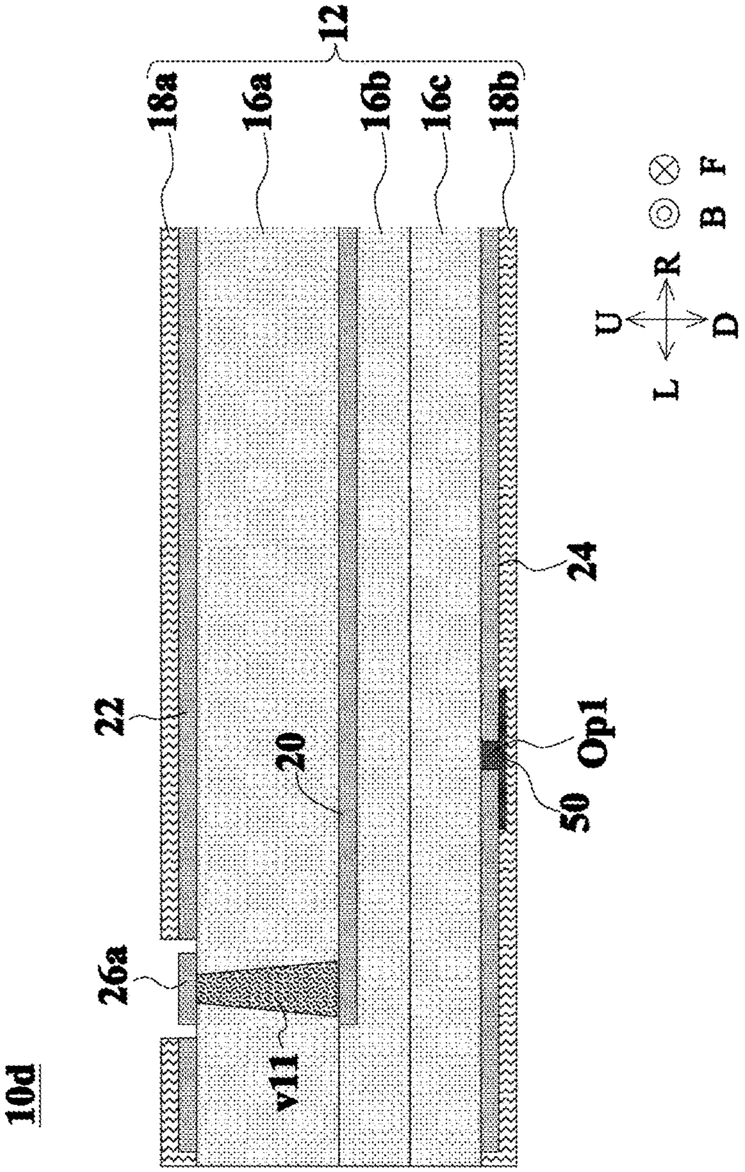
FIG. 9 is a sectional view of a multilayer substrate 10*d* according to an example embodiment of the present invention.

Hereinafter, a multilayer substrate 10*d* according to a fourth modification of an example embodiment of the present invention will be described with reference to the drawings. FIG. 9 is a sectional view of the multilayer substrate 10*d*.

The multilayer substrate 10*d* differs from the multilayer substrate 10 in that a conductor 50 is further provided. The first opening Op1 is filled with the conductor 50. The electrical conductivity of the conductor 50 is lower the electrical conductivity of the second reference conductor layer 24. The structures of the other portions of the multilayer substrate 10*d* are the same or substantially the same as those of the multilayer substrate 10, and the description thereof will thus be omitted. The multilayer substrate 10*d* can provide the advantageous effects (a) to (f) described above.

(i) In the multilayer substrate 10*d*, the first opening Op1 is filled with the conductor 50. The electrical conductivity of the conductor 50 is lower than the electrical conductivity of the second reference conductor layer 24. Accordingly, even if a flow in the undesired propagation mode moves in the second reference conductor layer 24 in the right direction, the undesired propagation mode undergoes attenuation due to the conductor 50. Thus, the undesired propagation mode is reduced or prevented from resulting in noise radiation from the space between the interlayer connection conductor v2 and the interlayer connection conductor v3 and the space between the interlayer connection conductor v5 and the interlayer connection conductor v6.

(j) In the multilayer substrate 10*d*, the first opening Op1 is filled with the conductor 50. Thus, the entry of noise into the multilayer substrate 10*d* through the first opening Op1 is reduced or prevented. In addition, the radiation of noise to the outside of the multilayer substrate 10*d* through the first opening Op1 is reduced or prevented.

Fifth Modification

Figure 10:
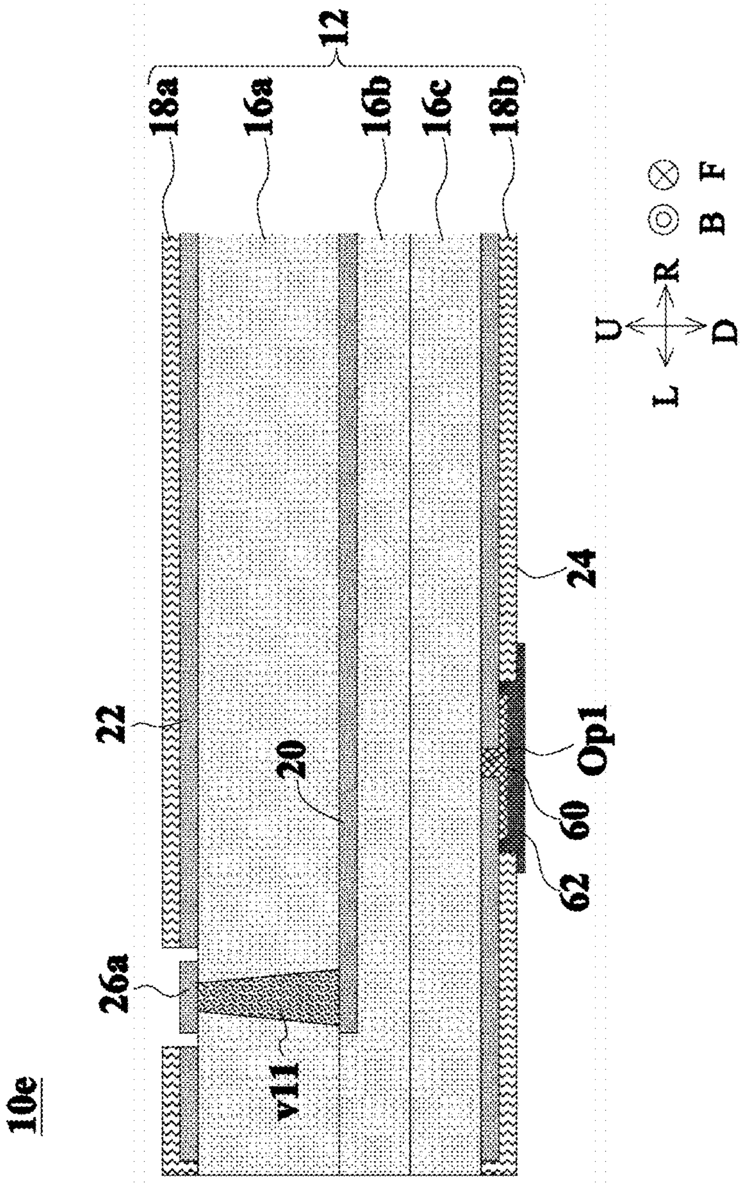
FIG. 10 is a sectional view of a multilayer substrate 10*e* according to an example embodiment of the present invention.

Hereinafter, a multilayer substrate 10*e* according to a fifth modification of an example embodiment of the present invention will be described with reference to the drawings. FIG. 10 is a sectional view of the multilayer substrate 10*e*.

The multilayer substrate 10*e* differs from the multilayer substrate 10 in that an insulator 60 and a conductor 62 are further provided. The first opening Op1 is filled with the insulator 60. The material for the insulator 60 may be the same as or may differ from the material for the insulator layers 16*a* to 16*c*. In addition, the material for the insulator 60 may be the same as or may differ from the material for the protective layers 18*a* and 18*b*. The conductor 62 covers the insulator 60. The electrical conductivity of the conductor 62 is lower than the electrical conductivity of the second reference conductor layer 24. The structures of the other portions of the multilayer substrate 10*e* are the same or substantially the same as those of the multilayer substrate 10, and the description thereof will thus be omitted. The multilayer substrate 10*e* can provide the advantageous effects (a) to (f), (i), and (j) described above.

Sixth Modification

Figure 11:
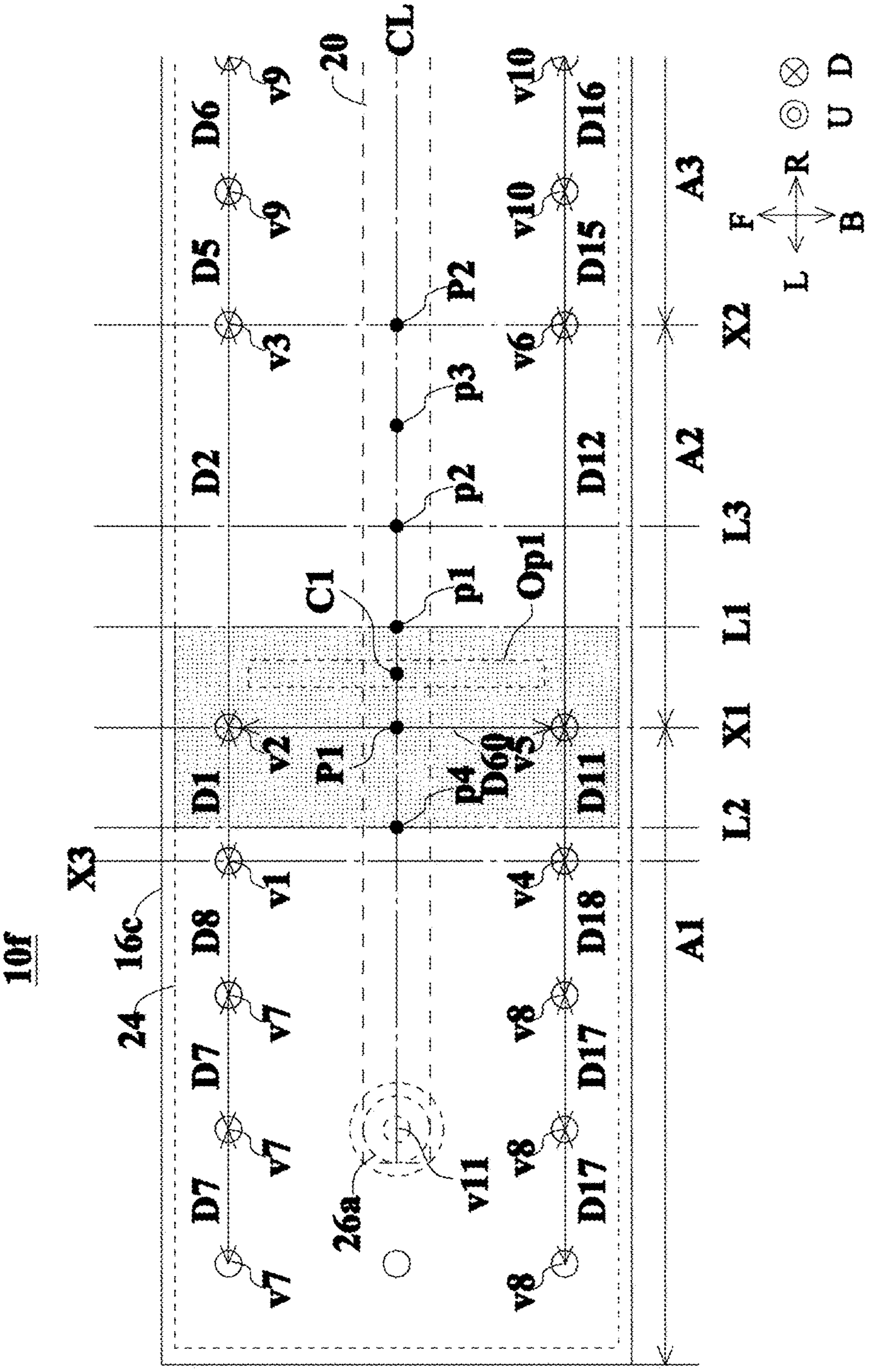
FIG. 11 is a top view of the insulator layer 16*c*.

Hereinafter, a multilayer substrate 10*f* according to a sixth modification of an example embodiment of the present invention will be described with reference to the drawings. FIG. 11 is a top view of the insulator layer 16*c*.

The multilayer substrate 10*f* differs from the multilayer substrate 10 in that multiple interlayer connection conductors v7 and multiple interlayer connection conductors v8 are provided. The multiple interlayer connection conductors v7 (the seventh interlayer connection conductors) are positioned on the left of (in the negative X-axis direction relative to) the interlayer connection conductor v1 (the first interlayer connection conductor) and are arranged along the signal conductor layer 20. A spacing D7 of the multiple interlayer connection conductors v7 (the seventh interlayer connection conductors) in the left-right direction (the X-axis direction) is shorter than the distance D2 between the interlayer connection conductor v2 (the second interlayer connection conductor) and the interlayer connection conductor v3 (the third interlayer connection conductor) in the left-right direction (the X-axis direction). Moreover, a distance D8 between the rightmost (in the positive X-axis direction) interlayer connection conductor v7 (the seventh interlayer connection conductor) of the multiple interlayer connection conductors v7 (the seventh interlayer connection conductors) and the interlayer connection conductor v1 (the first interlayer connection conductor) in the left-right direction (the X-axis direction) is shorter than the distance D2 between the interlayer connection conductor v2 (the second interlayer connection conductor) and the interlayer connection conductor v3 (the third interlayer connection conductor) in the left-right direction (the X-axis direction). The spacing D7 and the distance D8 are each equal or substantially equal to the distance D1.

The multiple interlayer connection conductors v8 (the eighth interlayer connection conductors) are positioned on the left of (in the negative X-axis direction relative to) the interlayer connection conductor v4 (the fourth interlayer connection conductor) and are arranged along the signal conductor layer 20. A spacing D17 of the multiple interlayer connection conductors v8 (the eighth interlayer connection conductors) in the left-right direction (the X-axis direction) is shorter than the distance D12 between the interlayer connection conductor v5 (the fifth interlayer connection conductor) and the interlayer connection conductor v6 (the sixth interlayer connection conductor) in the left-right direction (the X-axis direction). Moreover, a distance D18 between the rightmost (in the positive X-axis direction) interlayer connection conductor v8 (the eighth interlayer connection conductor) of the multiple interlayer connection conductors v8 (the eighth interlayer connection conductors) and the interlayer connection conductor v4 (the fourth interlayer connection conductor) in the left-right direction (the X-axis direction) is shorter than the distance D12 between the interlayer connection conductor v5 (the fifth interlayer connection conductor) and the interlayer connection conductor v6 (the sixth interlayer connection conductor) in the left-right direction (the X-axis direction). The spacing D17 and the distance D18 are each equal or substantially equal to the distance D11.

The interlayer connection conductor v11 (the eleventh interlayer connection conductor) is positioned in a section surrounded by the interlayer connection conductor v1 (the first interlayer connection conductor), the interlayer connection conductor v2 (the second interlayer connection conductor), the interlayer connection conductor v4 (the fourth interlayer connection conductor), the interlayer connection conductor v5 (the fifth interlayer connection conductor), the multiple interlayer connection conductors v7 (the seventh interlayer connection conductors), and the multiple interlayer connection conductors v8 (the eighth interlayer connection conductors). The structures of the other portions of the multilayer substrate 10*f* are the same or substantially the same as those of the multilayer substrate 10, and the description thereof will thus be omitted. The multilayer substrate 10*f* can provide the advantageous effects (a) to (f) described above.

Seventh Modification

Figure 12:
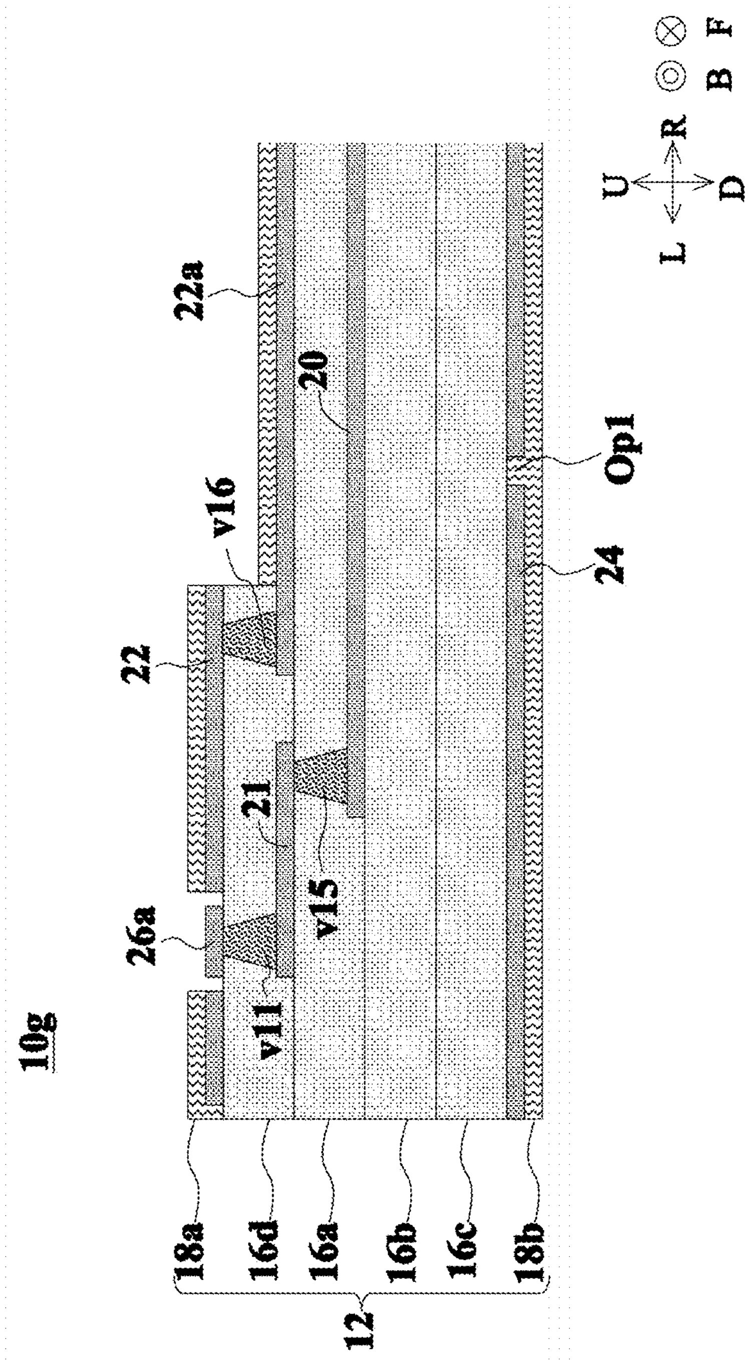
FIG. 12 is a sectional view of a multilayer substrate 10*g* according to an example embodiment of the present invention.

Hereinafter, a multilayer substrate log according to a seventh modification of an example embodiment of the present invention will be described with reference to the drawings. FIG. 12 is a sectional view of the multilayer substrate log.

The multilayer substrate log differs from the multilayer substrate 10 in that a signal conductor layer 21, a first reference conductor layer 22*a*, an insulator layer 16*d*, and an interlayer connection conductor v15, and an interlayer connection conductor v16 are further provided. The insulator layer 16*d* is laminated on the insulator layer 16*a*. However, the insulator layer 16*d* is provided in only a left end portion of the multilayer substrate log. The signal conductor layer 21 is positioned on the upper main surface of the insulator layer 16*a*. The interlayer connection conductor v15 extends through the insulator layer 16*a* in the up-down direction. The interlayer connection conductor v15 electrically connects the left end portion of the signal conductor layer 20 and a right end portion of the signal conductor layer 21. The interlayer connection conductor v11 electrically connects a left end portion of the signal conductor layer 21 and the signal terminal 26*a*. The interlayer connection conductors v11 and v15 do not overlap the first opening Op1 when viewed in the up-down direction. The first reference conductor layer 22*a* is positioned on the upper main surface of the insulator layer 16*a*. The interlayer connection conductor v16 electrically connects the first reference conductor layer 22*a* and the first reference conductor layer 22. The structures of the other parts of the multilayer substrate 10*g* are the same or substantially the same as those of the multilayer substrate 10, and the description thereof will thus be omitted. The multilayer substrate 10*g* can provide the advantageous effects (a) to (f) described above.

Eighth Modification

Figure 13:
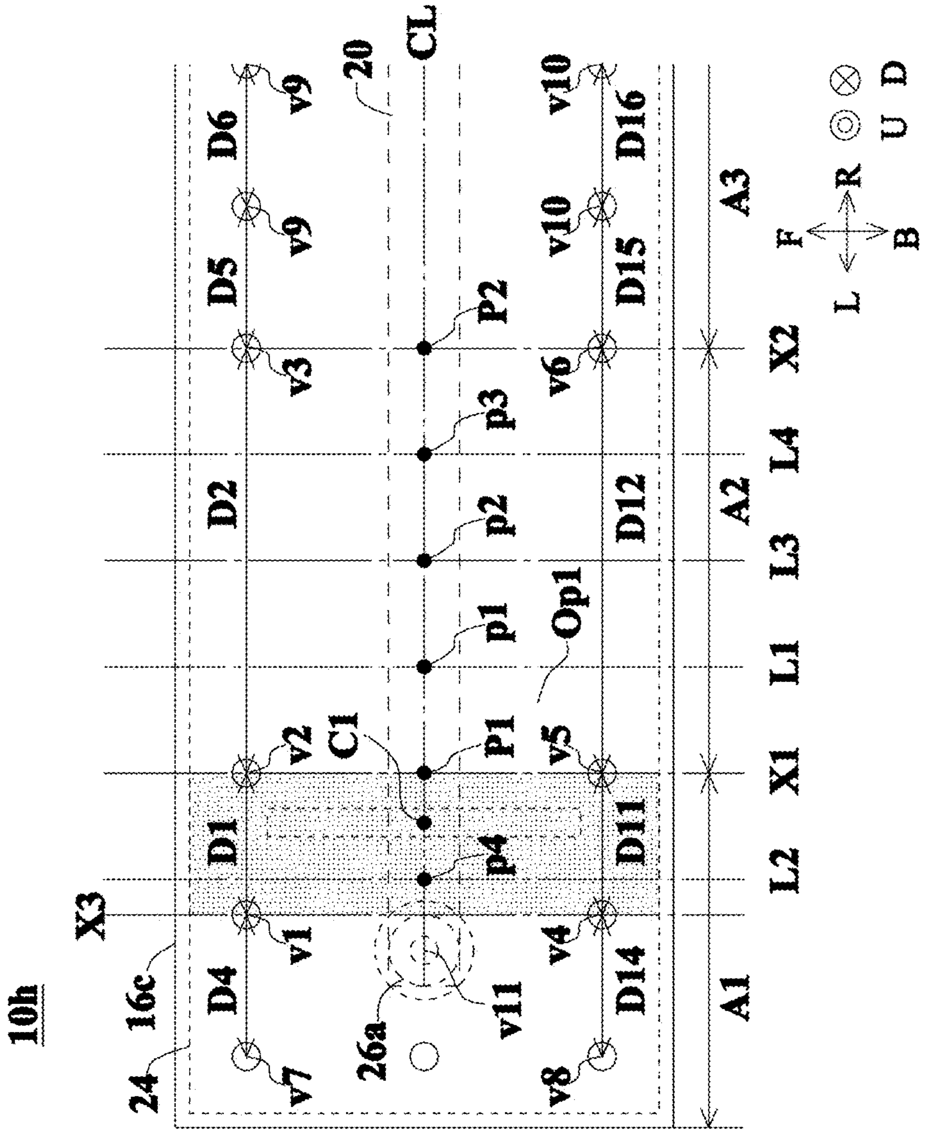
FIG. 13 is a top view of the insulator layer 16*c*.

Hereinafter, a multilayer substrate 10*h* according to an eighth modification of an example embodiment of the present invention will be described with reference to the drawings. FIG. 13 is a top view of the insulator layer 16*c*.

The multilayer substrate 10*h* differs from the multilayer substrate 10 in that the first opening Op1 is positioned between the first reference straight line X1 and the straight line X3 when viewed in the up-down direction. More precisely, the first opening Op1 is positioned on the left of the first reference straight line X1 and on the right of the straight line X3. The structures of the other portions of the multilayer substrate 10*h* are the same or substantially the same as those of the multilayer substrate 10, and the description thereof will thus be omitted. The multilayer substrate 10*h* can provide the advantageous effects (a) to (f) described above.

Other Example Embodiments

The multilayer substrates according to example embodiments of the present invention are not limited to any one of the multilayer substrates 10 and 10*a* to 10*h* and can be changed without departing from the spirit of the present invention. In addition, any combination of the structures of the multilayer substrates 10 and 10*a* to 10*h* may be possible.

In the multilayer substrate 10*a*, the number of the second openings is not limited to four. The number of the second openings may be one or more and three or less or may be five or more.

The signal conductor layer 20 may be bent when viewed in the up-down direction. In this case, the multilayer substrates 10 and 10*a* to 10*g* each include a section in which the X-axis direction corresponds to the left-right direction and a section in which the X-axis direction does not correspond to the left-right direction.

The first opening Op1 may be provided in the first reference conductor layer 22, not in the second reference conductor layer 24. In this case, no conductor layer is inside the first opening Op1. Thus, the first opening Op1 differs from, for example, an opening, for the signal terminal 26*a*, provided in the first reference conductor layer 22.

The signal conductor layer 20 may be bent in the front direction or in the back direction when viewed in the up-down direction.

In FIG. 12, the first opening Op1 may be provided in the first reference conductor layer 22. The multilayer substrates 10 and 10*a* to 10*h* are provided to eliminate the noise resulting from the capacitance generated between the reference conductor overlapping the interlayer connection conductor v11 and the interlayer connection conductor v11. Thus, in the multilayer substrate 10*g*, since it is sufficient for the first opening Op1 to be provided in the reference conductor overlapping the interlayer connection conductor v11, the first opening Op1 may be provided in the first reference conductor layer 22 or may be provided in the second reference conductor layer 24.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:

a multilayer body including insulator layers that are laminated in a Z-axis direction;

a signal conductor layer in the multilayer body and with a linear shape extending in an X-axis direction orthogonal or substantially orthogonal to the Z-axis direction;

a first reference conductor layer in the multilayer body, positioned in a positive direction of a Z axis relative to the signal conductor layer, and overlapping the signal conductor layer when viewed in the Z-axis direction;

a second reference conductor layer in the multilayer body, positioned in a negative direction of the Z axis relative to the signal conductor layer, and overlapping the signal conductor layer when viewed in the Z-axis direction;

a first interlayer connection conductor, a second interlayer connection conductor, and a third interlayer connection conductor electrically connecting the first reference conductor layer and the second reference conductor layer, positioned in a positive direction of a Y axis orthogonal or substantially orthogonal to the X-axis direction and the Z-axis direction relative to the signal conductor layer, and arranged along the signal conductor layer in this order in a positive direction of an X axis;

a fourth interlayer connection conductor, a fifth interlayer connection conductor, and a sixth interlayer connection conductor electrically connecting the first reference conductor layer and the second reference conductor layer, positioned in a negative direction of the Y axis relative to the signal conductor layer, and arranged along the signal conductor layer in this order in the positive direction of the X axis; and an eleventh interlayer connection conductor connected to the signal conductor layer, positioned in the positive direction of the Z axis relative to the signal conductor layer, and extending through at least one of the multiple insulator layers along the Z axis; wherein a distance between the second interlayer connection conductor and the third interlayer connection conductor in the X-axis direction is longer than a distance between the first interlayer connection conductor and the second interlayer connection conductor in the X-axis direction;

a distance between the fifth interlayer connection conductor and the sixth interlayer connection conductor in the X-axis direction is longer than a distance between the fourth interlayer connection conductor and the fifth interlayer connection conductor in the X-axis direction;

one of the first reference conductor layer and the second reference conductor layer overlapping the eleventh interlayer connection conductor includes a first opening overlapping the signal conductor layer when viewed in the Z-axis direction;

when viewed in the Z-axis direction, the first opening is positioned in a negative direction of the X axis relative to a vicinity of a first reference straight line connecting the second interlayer connection conductor and the fifth interlayer connection conductor;

when viewed in the Z-axis direction, the first opening is positioned in the positive direction of the X axis relative to the eleventh interlayer connection conductor; and no other conductor is provided in the first opening.

2. The multilayer substrate according to claim 1, wherein when viewed in the Z-axis direction, a first intersection point is defined as an intersection point of the first reference straight line and a center line of the signal conductor layer;

when viewed in the Z-axis direction, a second intersection point is defined as an intersection point of a second reference straight line connecting the third interlayer connection conductor and the sixth interlayer connection conductor and the center line of the signal conductor layer;

a section between the first intersection point and the second intersection point is divided into quarters by a first point, a second point, and a third point that are arranged in the positive direction of the X axis;

a fourth point is defined as a point spaced apart from the first intersection point in the negative direction of the X axis by a distance equal or substantially equal to a distance between the first point and the second point; and when viewed in the Z-axis direction, the first opening is positioned between a first straight line extending through the first point and orthogonal or substantially orthogonal to the signal conductor layer and a second straight line extending through the fourth point and orthogonal or substantially orthogonal to the signal conductor layer.

3. The multilayer substrate according to claim 1, further comprising:

seventh interlayer connection conductors electrically connecting the first reference conductor layer and the second reference conductor layer and positioned in the positive direction of the Y axis relative to the signal conductor layer;

eighth interlayer connection conductors electrically connecting the first reference conductor layer and the second reference conductor layer and positioned in the negative direction of the Y axis relative to the signal conductor layer; and a signal terminal positioned on a main surface, of the multilayer body, in the positive direction of the Z axis; wherein the eleventh interlayer connection conductor electrically connects the signal terminal and the signal conductor layer;

the seventh interlayer connection conductors are arranged, along the signal conductor layer, in the negative direction of the X axis relative to the first interlayer connection conductor;

a spacing of the seventh interlayer connection conductors in the X-axis direction is shorter than the distance between the second interlayer connection conductor and the third interlayer connection conductor in the X-axis direction;

a distance between one of the seventh interlayer connection conductors on a most downstream side in the positive direction of the X axis and the first interlayer connection conductor in the X-axis direction is shorter than the distance between the second interlayer connection conductor and the third interlayer connection conductor in the X-axis direction;

the eighth interlayer connection conductors are arranged, along the signal conductor layer, in the negative direction of the X axis relative to the fourth interlayer connection conductor;

a spacing of the eighth interlayer connection conductors in the X-axis direction is shorter than the distance between the fifth interlayer connection conductor and the sixth interlayer connection conductor in the X-axis direction;

a distance between one of the eighth interlayer connection conductors on a most downstream side in the positive direction of the X axis and the fourth interlayer connection conductor in the X-axis direction is shorter than the distance between the fifth interlayer connection conductor and the sixth interlayer connection conductor in the X-axis direction; and the eleventh interlayer connection conductor is positioned in a section surrounded by the first interlayer connection conductor, the second interlayer connection conductor, the fourth interlayer connection conductor, the fifth interlayer connection conductor, the seventh interlayer connection conductors, and the eighth interlayer connection conductors.

4. The multilayer substrate according to claim 2, wherein no opening is provided in a section between the first straight line and the second reference straight line.

5. The multilayer substrate according to claim 1, wherein, when viewed in the Z-axis direction, an end of the first opening in the negative direction of the X axis is positioned in the positive direction of the X axis relative to an end of the first interlayer connection conductor in the positive direction of the X axis and an end of the fourth interlayer connection conductor in the positive direction of the X axis.

6. The multilayer substrate according to claim 1, wherein an end of the first opening in the positive direction of the Y axis is positioned in the negative direction of the Y axis relative to an end of the second interlayer connection conductor in the positive direction of the Y axis; and an end of the first opening in the negative direction of the Y axis is positioned in the positive direction of the Y axis relative to an end of the fifth interlayer connection conductor in the negative direction of the Y axis.

7. The multilayer substrate according to claim 1, wherein a width of the first opening in a Y-axis direction is larger than a width of the first opening in the X-axis direction.

8. The multilayer substrate according to claim 1, wherein a width of the first opening in a Y-axis direction is more than or equal to about half a distance between an end of the second interlayer connection conductor in the negative direction of the Y axis and an end of the fifth interlayer connection conductor in the positive direction of the Y axis.

9. The multilayer substrate according to claim 1, wherein when viewed in the Z-axis direction, a first intersection point is defined as an intersection point of the first reference straight line and a center line of the signal conductor layer;

when viewed in the Z-axis direction, a second intersection point is defined as an intersection point of a second reference straight line connecting the third interlayer connection conductor and the sixth interlayer connection conductor and the center line of the signal conductor layer;

a section between the first intersection point and the second intersection point is divided into quarters by a first point, a second point, and a third point that are arranged in the positive direction of the X axis;

at least one second opening is provided in the second reference conductor layer;

a fourth point is defined as a point spaced apart from the first intersection point in the negative direction of the X axis by a distance equal or substantially equal to a distance between the first point and the second point;

a second straight line is a line extending through the fourth point and orthogonal or substantially orthogonal to the signal conductor layer;

the at least one second opening is positioned between a first straight line extending through the first point and orthogonal or substantially orthogonal to the signal conductor layer and the second straight line; and when viewed in the X-axis direction, a width, in a Y-axis direction, of a region in which the first opening and the at least one second opening exist is more than or equal to half a distance, in the Y-axis direction, between an end of the second interlayer connection conductor in the negative direction of the Y axis and an end of the fifth interlayer connection conductor in the positive direction of the Y axis.

10. The multilayer substrate according to claim 1, wherein the multilayer substrate is bent at a portion of a section between a straight line connecting the second interlayer connection conductor and the fifth interlayer connection conductor and a straight line connecting the third interlayer connection conductor and the sixth interlayer connection conductor.

11. The multilayer substrate according to claim 1, wherein each of the insulator layers includes a thermoplastic resin.

12. The multilayer substrate according to claim 11, wherein the thermoplastic resin includes a liquid crystal polymer.

13. The multilayer substrate according to claim 1, wherein the first reference conductor layer covers an entirety or substantially an entirety of an upper surface of one of the insulator layers.

14. The multilayer substrate according to claim 1, wherein a ground potential is connected to the first reference conductor layer.

15. The multilayer substrate according to claim 1, wherein the first reference conductor layer covers an entirety or substantially an entirety of an upper surface of one of the insulator layers.

16. The multilayer substrate according to claim 1, wherein a ground potential is connected to the first reference conductor layer.

17. The multilayer substrate according to claim 1, wherein the signal terminal has a circular or substantially circular shape.

* * * * *